(12) United States Patent
Sadakata

(10) Patent No.: US 6,711,050 B2
(45) Date of Patent: Mar. 23, 2004

(54) SEMICONDUCTOR MEMORY

(75) Inventor: Hiroyuki Sadakata, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/358,202

(22) Filed: Feb. 5, 2003

(65) Prior Publication Data

US 2003/0151943 A1 Aug. 14, 2003

(30) Foreign Application Priority Data

Feb. 14, 2002 (JP) .................................... 2002-036297

(51) Int. Cl.[7] ................................................. G11C 7/00
(52) U.S. Cl. ........................... 365/149; 365/51; 365/63
(58) Field of Search ............................ 365/149, 51, 63, 365/205

(56) References Cited

U.S. PATENT DOCUMENTS

| | | | |
|---|---|---|---|
| 5,396,450 A | 3/1995 | Takashima et al. | 365/51 |
| 5,923,593 A | 7/1999 | Hsu et al. | 365/189.04 |
| 6,169,684 B1 | 1/2001 | Takahashi et al. | 365/49 |
| 6,181,620 B1 * | 1/2001 | Agata et al. | 365/203 |
| 6,226,223 B1 * | 5/2001 | Shirahama et al. | 365/233 |
| 6,639,846 B2 * | 10/2003 | Nikutta | 365/189.07 |

* cited by examiner

*Primary Examiner*—Gene Auduong
(74) *Attorney, Agent, or Firm*—McDermott, Will & Emery

(57) ABSTRACT

A folded bitline type sense amplifier circuit is disposed at an outer side of an end memory cell array in which 2Tr1C type cells each composed of a data storage capacitor, an A port access transistor and a B port access transistor are arranged in the form of a matrix, and two word lines used for cell selection are connected to corresponding gates of the A and B port access transistors. The drain of the A port access transistor is connected to one bit line of an open bitline type sense amplifier circuit, and the drain of the B port access transistor is connected to one bit line out of a bit line pair of the folded bitline sense amplifier circuit.

8 Claims, 5 Drawing Sheets

SEMICONDUCTOR MEMORY

BACKGROUND OF THE INVENTION

The present invention relates to a semiconductor memory, and more particularly, it relates to a DRAM (dynamic random access memory).

U.S. Pat. No. 5,923,593 discloses a dual-port DRAM cell. According to the disclosure of this patent, each DRAM cell is a two-transistor-one-capacitor (2Tr1C) type cell composed of two access transistors and one data storage capacitor. Assuming that two ports used for making accesses to the data storage capacitor of this DRAM cell are respectively designated as an A port and a B port, the two access transistors are respectively designated as an A port access transistor and a B port access transistor. The A port access transistor has a source connected to one electrode of the data storage capacitor, a gate connected to an A port word line and a drain connected to an A port bit line. The B port access transistor has a source connected to the identical electrode of the data storage capacitor, a gate connected to a B port word line and a drain connected to a B port bit line. The other electrode of the data storage capacitor is connected to a constant supply voltage. This cell configuration enables fast overlapping accesses by utilizing the A port and the B port. For example, while precharging the A port bit line, data can be read or written through the B port.

The above-described U.S. patent also discloses a semiconductor memory including first, second and third memory cell arrays. Each memory cell array is a 2Tr1C type memory cell array including a plurality of DRAM cells each having the aforementioned configuration. An A port sense amplifier circuit is disposed between the first memory cell array and the adjacent second memory cell array, and a B port sense amplifier circuit is disposed between the second memory cell array and the adjacent third memory cell array. The A port sense amplifier circuit is connected to A port bit lines of the first memory cell array and to A port bit lines of the second memory cell array respectively forming pairs with the A port bit lines of the first memory cell array. Since read accesses are never made simultaneously to the first memory cell array and the second memory cell array, the A port sense amplifier circuit can differentially amplify a data signal appeared on an A port bit line of the first or second memory cell array without a fail. On the other hand, the B port sense amplifier circuit is connected to B port bit lines of the second memory cell array and B port bit lines of the third memory cell array respectively forming pairs with the B port bit lines of the second memory cell array. In other words, this semiconductor memory employs what is called an open bitline architecture. Both the A port sense amplifier circuit and the B port sense amplifier circuit are open bitline type sense amplifier circuits.

Data stored in the second memory cell array can be read through the A port sense amplifier circuit disposed on the side of the first memory cell array or through the B port sense amplifier circuit disposed on the side of the third memory cell array. However, the B ports cannot be accessed in the first memory cell array disposed at one end and the A ports cannot be accessed in the third memory cell array disposed at the other end. Therefore, according to this U.S. patent, an open bitline type B port sense amplifier circuit is disposed, for example, outside the first memory cell array and a dummy array is disposed outside this B port sense amplifier circuit. Thus, the B ports of the first memory cell array can be accessed, whereas the dummy array cannot be accessed.

In other words, the dummy array used in this conventional semiconductor memory merely provides reference bit lines to the bit lines of the adjacent memory cell array. Thus, although the dummy array disposed at the end is a 2Tr1C type array including a plurality of dual-port DRAM cells similarly to the essential memory cell arrays, no port of the dummy array can be accessed, which is ineffectual.

SUMMARY OF THE INVENTION

An object of the invention is utilizing, for data storage, a dummy array provided in a conventional semiconductor memory having the open bitline architecture, so as to increase usable memory capacity.

In order to achieve the object, the first semiconductor memory of this invention is obtained by replacing the conventional dummy array with an array having both the open bitline architecture and a folded bitline architecture. Specifically, a folded bitline type sense amplifier circuit is provided outside the conventional 2Tr1C type dummy array and the conventional dummy array is provided with word lines so as to be utilized as an end memory cell array.

Specifically, the first semiconductor memory of this invention includes a first memory cell array including first memory cells; first word lines extending into the first memory cell array; a second memory cell array including second memory cells and disposed adjacent to the first memory cell array; second word lines extending into the second memory cell array; a first sense amplifier circuit disposed between the first memory cell array and the second memory cell array; and a second sense amplifier circuit disposed on a side of the second memory cell array opposite to the first sense amplifier circuit. The first sense amplifier circuit is an open bitline type sense amplifier circuit connected to first bit lines extending into the first memory cell array and to second bit lines respectively forming pairs with the first bit lines and extending into the second memory cell array. The second sense amplifier circuit is a folded bitline type sense amplifier circuit connected to third bit lines extending into the second memory cell array and fourth bit lines respectively forming pairs with the third bit lines and extending into the second memory cell array. Each of the first memory cells is a 2Tr1C type cell including a first transistor having a drain connected to one of the first bit lines and a gate connected to one of the first word lines; a second transistor having a source connected to a source of the first transistor and a gate connected to another of the first word lines; and a first data storage capacitor having two electrodes one of which is connected to the sources of the first and second transistors. Each of the second memory cells is also a 2Tr1C type cell including a third transistor having a drain connected to one of the second bit lines and a gate connected to one of the second word lines; a fourth transistor having a drain connected to one of the third or fourth bit lines, a source connected to a source of the third transistor and a gate connected to another of the second word lines; and a second data storage capacitor having two electrodes one of which is connected to the sources of the third and fourth transistors.

Alternatively, the second semiconductor memory of this invention is obtained by replacing each 2Tr1C type cell of the conventional dummy array with two 1Tr1C type cells (each composed of one access transistor and one data storage capacitor), replacing the dummy array with an array having both the open bitline architecture and the folded bitline architecture and providing the dummy array with word lines. Thus, the conventional dummy array can be utilized as an end memory cell array.

Specifically, the second semiconductor memory of this invention includes a first memory cell array including first memory cells; first word lines extending into the first memory cell array; a second memory cell array including second memory cells and third memory cells and disposed adjacent to the first memory cell array; second word lines extending into the second memory cell array; a first sense amplifier circuit disposed between the first memory cell array and the second memory cell array; and a second sense amplifier circuit disposed on a side of the second memory cell array opposite to the first sense amplifier circuit. The first sense amplifier circuit is an open bitline type sense amplifier circuit connected to first bit lines extending into the first memory cell array and to second bit lines respectively forming pairs with the first bit lines and extending into the second memory cell array. The second sense amplifier circuit is a folded bitline type sense amplifier circuit connected to third bit lines extending into the second memory cell array and to fourth bit lines respectively forming pairs with the third bit lines and extending into the second memory cell array. Each of the first memory cells is a 2Tr1C type cell including a first transistor having a drain connected to one of the first bit lines and a gate connected to one of the first word lines; a second transistor having a source connected to a source of the first transistor and a gate connected to another of the first word lines; and a first data storage capacitor having two electrodes one of which is connected to the sources of the first and second transistors. Each of the second memory cells is a 1Tr1C type cell including a third transistor having a drain connected to one of the second bit lines and a gate connected to one of the second word lines; and a second data storage capacitor having two electrodes one of which is connected to a source of the third transistor. Each of the third memory cells is also a 1Tr1C type cell including a fourth transistor having a drain connected to one of the third or fourth bit lines and a gate connected to another of the second word lines; and a third data storage capacitor having two electrodes one of which is connected to a source of the fourth transistor.

In the first or second semiconductor memory, when one of the third bit lines and one of the fourth bit lines together forming a pair are disposed in the second memory cell array in such a manner that one of the second bit lines is sandwiched therebetween, interference between the second bit line and the pair of the third and fourth bit lines can be prevented.

Also, in the first or second semiconductor memory, when each one of the second word lines connected to the gate of the third transistor is kept in an unselected state, the second memory cell array can be always accessed independently of the first memory cell array. Accordingly, such a memory is suitably applied to the case where the first memory cell array is used as a main memory cell array and the second memory cell array is used as a cache memory cell array.

Further alternatively, the third semiconductor memory of this invention is obtained by providing a port connected to the open bitline type sense amplifier circuit in the conventional 2Tr1C type dummy array with word lines. Thus, the conventional dummy array can be utilized as an end memory cell array.

Specifically, the third semiconductor memory of this invention includes a first memory cell array including first memory cells; first word lines extending into the first memory cell array; a second memory cell array including second memory cells and disposed adjacent to the first memory cell array; second word lines extending into the second memory cell array; and a sense amplifier circuit disposed between the first memory cell array and the second memory cell array. The sense amplifier circuit disposed between the first memory cell array and the second memory cell array is an open bitline type sense amplifier circuit connected to first bit lines extending into the first memory cell array and to second bit lines respectively forming pairs with the first bit lines and extending into the second memory cell array. Each of the first memory cells is a 2Tr1C type cell including a first transistor having a drain connected to one of the first bit lines and a gate connected to one of the first word lines; a second transistor having a source connected to a source of the first transistor and a gate connected to another of the first word lines; and a first data storage capacitor having two electrodes one of which is connected to the sources of the first and second transistors. Each of the second memory cells is a memory cell including at least a third transistor having a drain connected to one of the second bit lines and a gate connected to one of the second word lines; and a second data storage capacitor having two electrodes one of which is connected to a source of the third transistor.

In the third semiconductor memory, each of the second memory cells may further include a fourth transistor having a drain connected to a fixed voltage, a source connected to the source of the third transistor and a gate connected to another of the second word lines, and each one of the second word lines connected to the gate of the fourth transistor may be kept in an unselected state. Thus, an unused port of the conventional 2Tr1C type dummy array can be steadily deactivated.

DETAILED DESCRIPTION OF THE INVENTION

Figure 1:
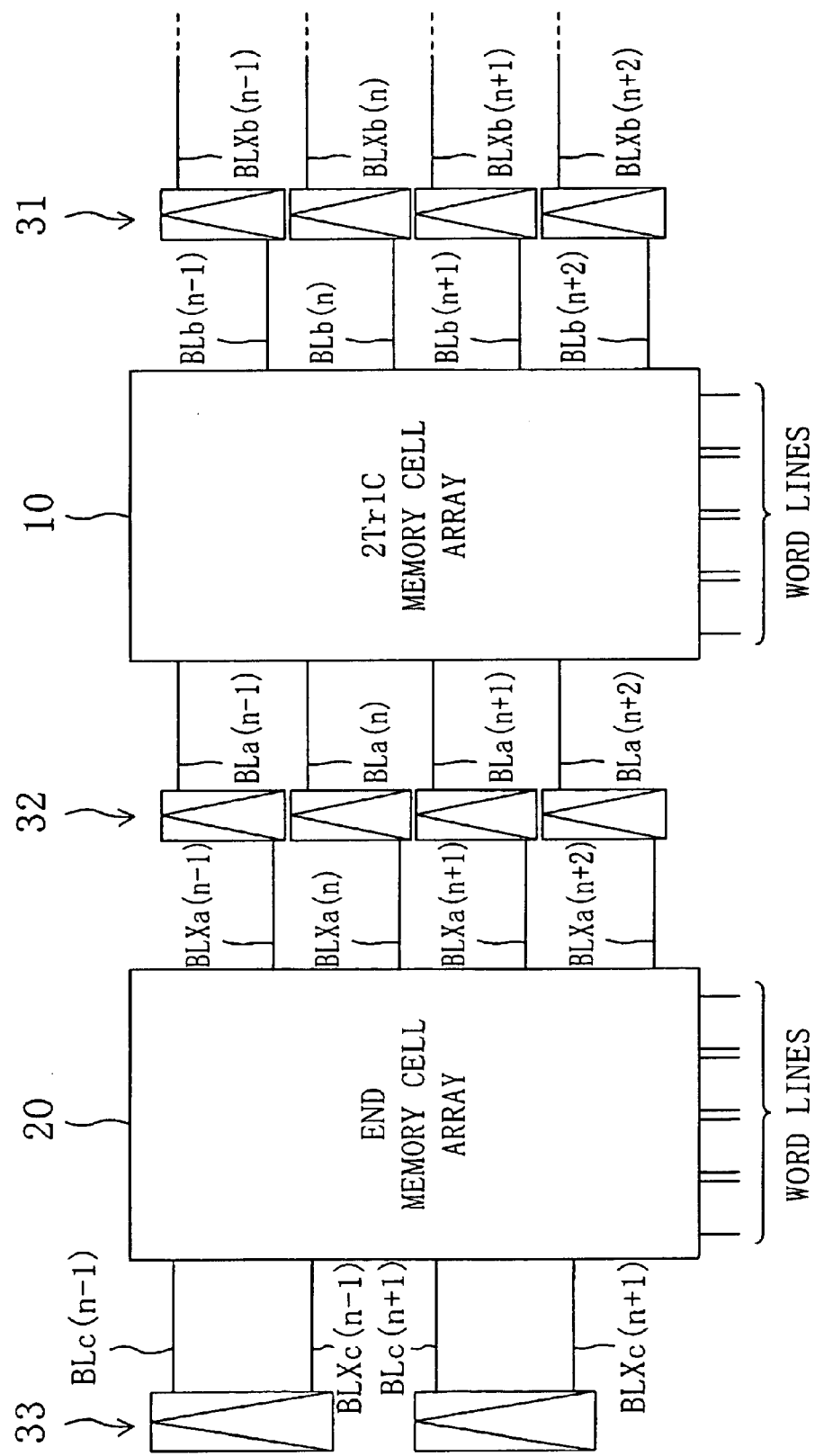
FIG. 1 is a block diagram for showing an exemplified architecture of a semiconductor memory according to this invention.

FIG. 1 shows an exemplified architecture of a semiconductor memory (DRAM) according to this invention. The DRAM of FIG. 1 includes a 2Tr1C memory cell array 10 and an end memory cell array 20 adjacent to the 2Tr1C memory cell array 10. A first open bitline type sense amplifier circuit 31 is disposed between the 2Tr1C memory cell array 10 and another 2Tr1C memory cell array not shown, a second open bitline type sense amplifier 32 is disposed between the 2Tr1C memory cell array 10 and the end memory cell array 20, and a folded bitline type sense amplifier circuit 33 is disposed on a side of the end memory cell array 20 opposite to the second open bitline type sense amplifier circuit 32. Assuming that "n" is an arbitrary integer, the first open bitline type sense amplifier circuit 31 is connected to B port bit lines BLb(n−1) through BLb(n+2) and to B port complementary bit lines BLXb(n−1) through BLXb(n+2) respectively forming pairs with the B port bit lines BLb(n−1) through BLb(n+2). The second open bitline type sense amplifier circuit 32 is connected to A port bit lines BLa(n−1) through BLa(n+2) and to A port complementary bit lines BLXa(n−1) through BLXa(n+2) respectively forming pairs with the A port bit lines BLa(n−1) through BLa(n+2). The folded bitline type sense amplifier circuit 33 is connected to end bit lines BLc(n−1) and BLc(n+1) and to end complementary bit lines BLXc(n−1) and BLXc(n+1) respectively forming pairs with the end bit lines BLc(n−1) and BLc(n+1). The B port complementary bit lines BLXb(n−1) through BLXb(n+2) extend into the 2Tr1C memory cell array not shown, the B port bit lines BLb(n−1) through BLb(n+2) and the A port bit lines BLa(n−1) through BLa(n+2) extend into the 2Tr1C memory cell array 10, and the A port complementary bit lines BLXa(n−1) through BLXa(n+2), the end bit lines BLc(n−1) and BLc(n+1) and the end complementary bit lines BLXc(n−1) and BLXc(n+1) extend into the end memory cell array 20.

Figure 2:
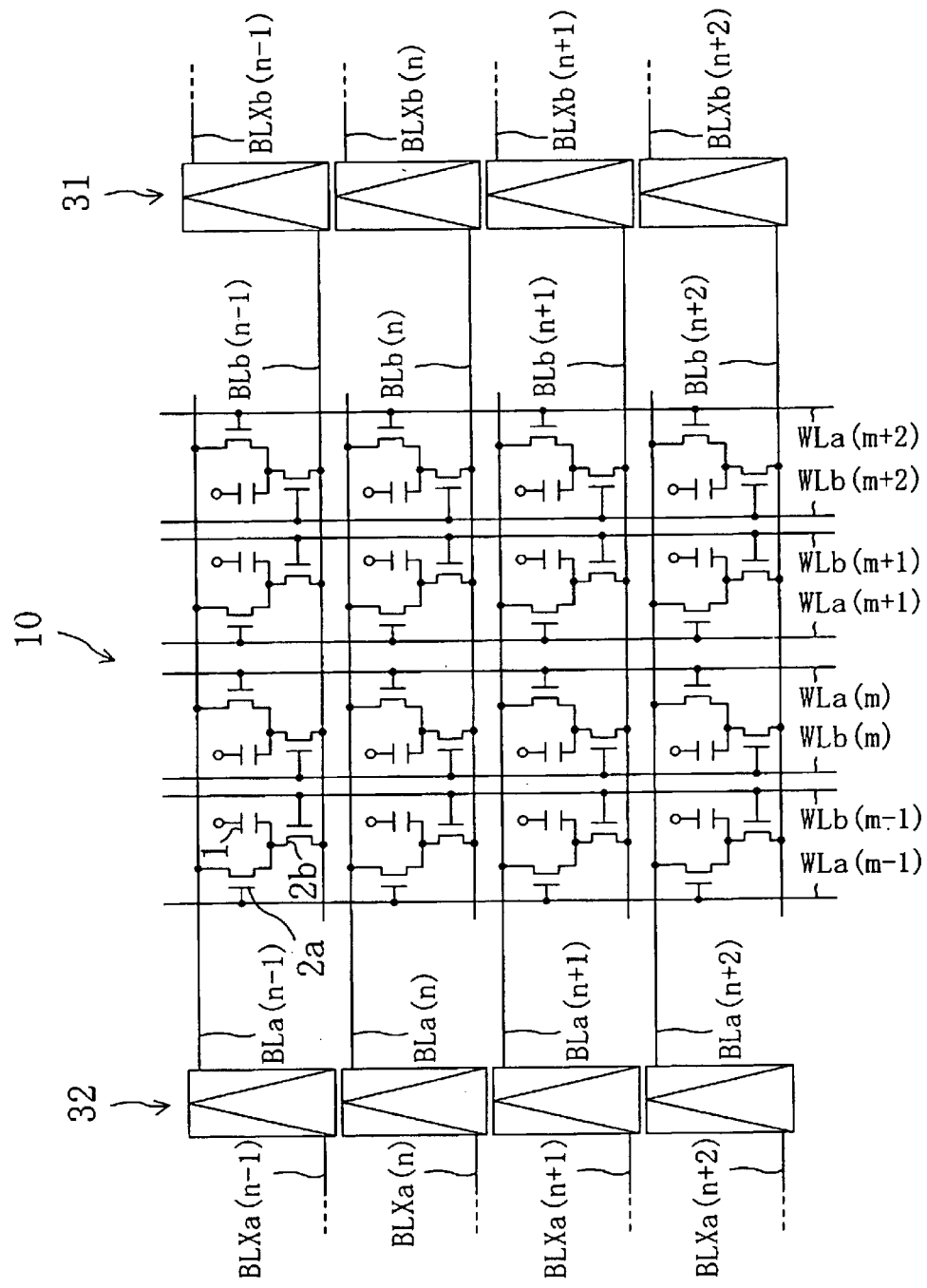
FIG. 2 is a circuit diagram for showing an exemplified detailed configuration of a 2Tr1C type memory cell array of FIG. 1.

FIG. 2 shows an exemplified detailed configuration of the 2Tr1C memory cell array 10 of FIG. 1. In FIG. 2, merely 4×4 DRAM cells are shown for simplification. Assuming that "m" is an arbitrary integer, A port word lines WLa(m−1) through WLa(m+2) and B port word lines WLb(m−1) through WLb(m+2) extend into the 2Tr1C memory cell array 10. Each DRAM cell includes a data storage capacitor 1, an A port access transistor 2a and a B port access transistor 2b. The A port access transistor 2a has a source connected to one electrode of the data storage capacitor 1, a gate connected to one of the A port word lines WLa(m−1) through WLa(m+2), and a drain connected to one of the A port bit lines BLa(n−1) through BLa(n+2). The B port access transistor 2b has a source connected to the identical electrode of the data storage capacitor 1, a gate connected to one of the B port word lines WLb(m−1) through WLb(m+2) and a drain connected to one of the B port bit lines BLb(n−1) through BLb(n+2). The other electrode of the data storage capacitor 1 is connected to a constant supply voltage.

In the configuration of FIG. 2, when one of the A port word lines WLa(m−1) through WLa(m+2) is selected, a data signal stored in the thus selected data storage capacitor 1 is read through the second open bitline type sense amplifier circuit 32. At this point, the A port complementary bit lines BLXa(n−1) through BLXa(n+2) apply a voltage, with reference to the A port bit lines BLa(n−1) through BLa(n+2), to the second open bitline type sense amplifier circuit 32. Also, when one of the B port word lines WLb(m−1) through WLb(m+2) is selected, a data signal stored in the thus selected data storage capacitor 1 is read through the first open bitline type sense amplifier circuit 31. At this point, the B port complementary bit lines BLXb(n−1) through BLXb(n+2) apply a voltage, with reference to the B port bit lines BLb(n−1) through BLb(n+2), to the first open bitline type sense amplifier circuit 31. The description of a write access and the like to the 2Tr1C memory cell array 10 is herein omitted.

Figure 3:
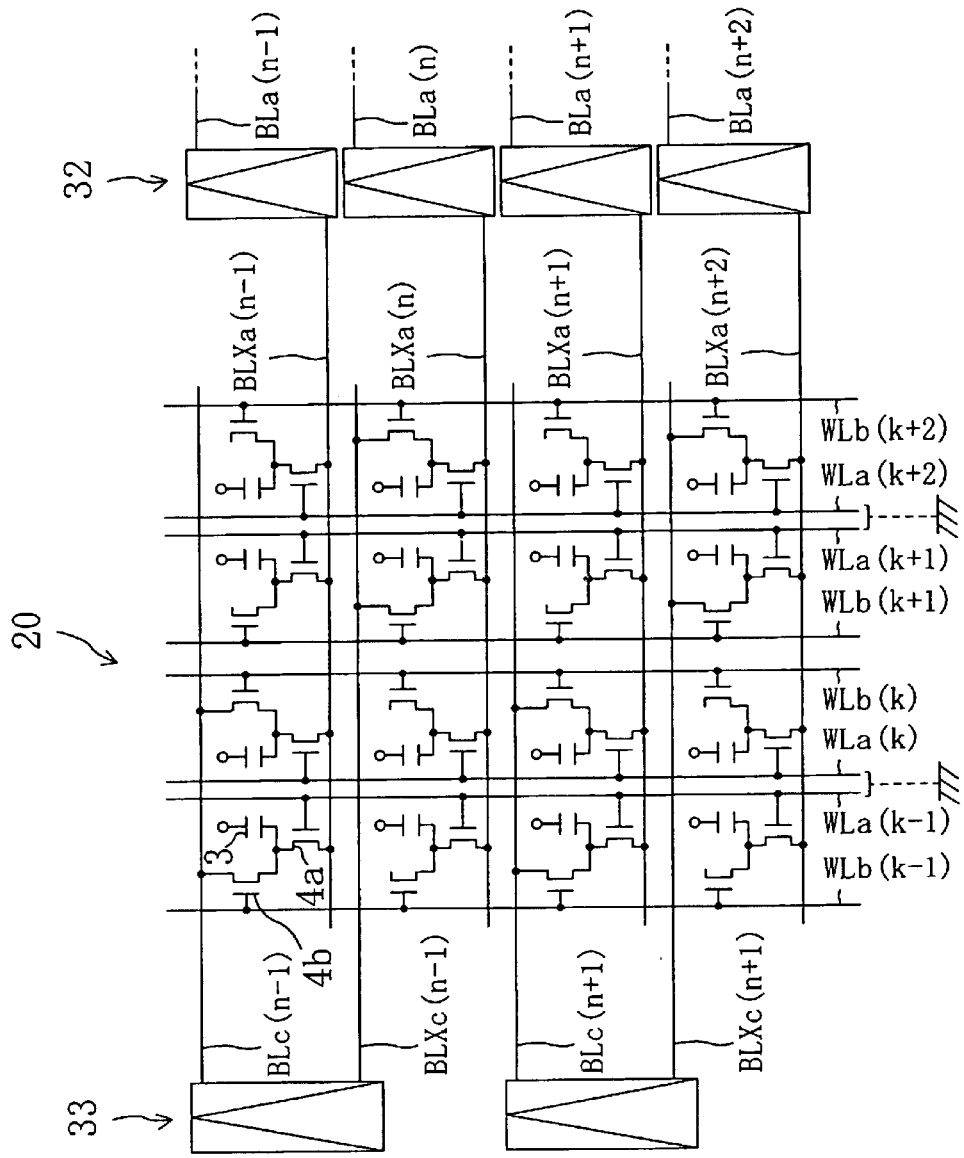
FIG. 3 is a circuit diagram for showing a first exemplified detailed configuration of an end memory cell array of FIG. 1.

FIG. 3 shows a first exemplified detailed configuration of the end memory cell array 20 of FIG. 1. In FIG. 3, merely 4×4 DRAM cells are shown for simplification. Assuming that "k" is an arbitrary integer, A port word lines WLa(k−1) through WLa(k+2) and B port word lines WLb(k−1) through WLb(k+2) extend into the end memory cell array 20. In the end memory cell array 20, the end bit line BLc(n−1) and the end complementary bit line BLXc(n−1) together forming a folded bit line pair are disposed so as to sandwich one A port complementary bit line BLXa(n−1), and similarly, the end bit line BLc(n+1) and the end complementary bit line BLXc(n+1) together forming a folded bit line pair are disposed so as to sandwich another A port complementary bit line BLXa(n+1). Each DRAM cell includes a data storage capacitor 3, an A port access transistor 4a and a B port access transistor 4b. The A port access transistor 4a has a source connected to one electrode of the data storage capacitor 3, a gate connected to one of the A port word lines WLa(k−1) through WLa(k+2) and a drain connected to one of the A port complementary bit lines BLXa(n−1) through BLXa(n+2). The B port access transistor 4b has a source connected to the identical electrode of the data storage capacitor 3, a gate connected to one of the B port word lines WLb(k−1) through WLb(k+2) and a drain connected to one of the end bit lines BLc(n−1) and BLc(n+1) and the end complementary bit lines BLXc(n−1) and BLXc(n+1). The bit line contacts of the drains of the B port access transistors 4b arranged along the word line direction may be alternately disconnected as shown in FIG. 3. The other electrode of the data storage capacitor 3 is connected to a constant supply voltage.

In the configuration of FIG. 3, when one of the A port word lines WLa(k−1) through WLa(k+2) is selected, a data signal stored in the thus selected data storage capacitor 3 is read through the second open bitline type sense amplifier circuit 32. At this point, the A port bit lines BLa(n−1) through BLa(n+2) apply a voltage, with reference to the A port complementary bit lines BLXa(n−1) through BLXa(n+2), to the second open bitline type sense amplifier circuit 32. Also, when one of the B port word lines WLb(k−1) through WLb(k+2) is selected, a data signal stored in the thus selected data storage capacitor 3 is read through the folded bitline type sense amplifier circuit 33. At this point, a reference voltage is applied to the folded bitline type sense amplifier circuit 33 by the end complementary bit lines BLXc(n−1) and BLXc(n+1) when the end bit lines BLc(n−1) and BLc(n+1) are used for reading data signals and by the end bit lines BLc(n−1) and BLc(n+1) when the complmentary end bit lines BLXc(n−1) and BLXc(n+1) are used for reading data signals. In this embodiment, since the bit line contacts of the drains of the B port access transistors 4b arranged along the word line direction are alternately disconnected, a data signal is not simultaneously read to the folded bit line pair, such as the pair of the end bit line BLc(n−1) and the end complementary bit line BLXc(n−1). The description of a write access and the like of the end memory cell array 20 is herein omitted.

As described so far, when the configuration of FIG. 3 is employed, while keeping a fast overlapping access, that is, the advantage of the 2Tr1C type cells, the end memory cell array 20, which corresponds to the conventional dummy array unable to access, can be utilized for data storage, resulting in increasing usable memory capacity. The end memory cell array 20 can be advantageously fabricated through the same process as the 2Tr1C memory cell array 10. In addition, since, for example, the end bit line BLc(n−1) and the end complementary bit line BLXc(n−1) are disposed in the end memory cell array 20 so as to sandwich the A port complementary bit line BLXa(n−1), interference such as noise propagation between the pair of the end bit line BLc(n−1) and the end complementary bit line BLXc(n−1) and the A port complementary bit line BLXa(n−1) can be prevented.

When all the A port word lines WLa(k−1) through WLa(k+2) are kept in an unselected state as shown with broken lines in FIG. 3, the end memory cell array 20 can be always accessed independently of the 2Tr1C memory cell array 10. This architecture corresponds to the case where the end memory cell array 20 is constructed from 1Tr1C type cells, and is suitably applied to the case where the 2Tr1C memory cell array 10 is used as a main memory cell array and the end memory cell array 20 is used as a cache memory cell array. In addition, as compared with the case where each of 2Tr1C type cells of the conventional dummy array is replaced with two 1Tr1C cells, the data storage capacitor 3 can advantageously attain a double capacitance value. Also when all the B port word lines WLb(k−1) through WLb(k+2) are kept in an unselected state instead of the A port word lines WLa(k−1) through WLa(k+2), the effect to increase the memory capacity can be attained.

Figure 4:
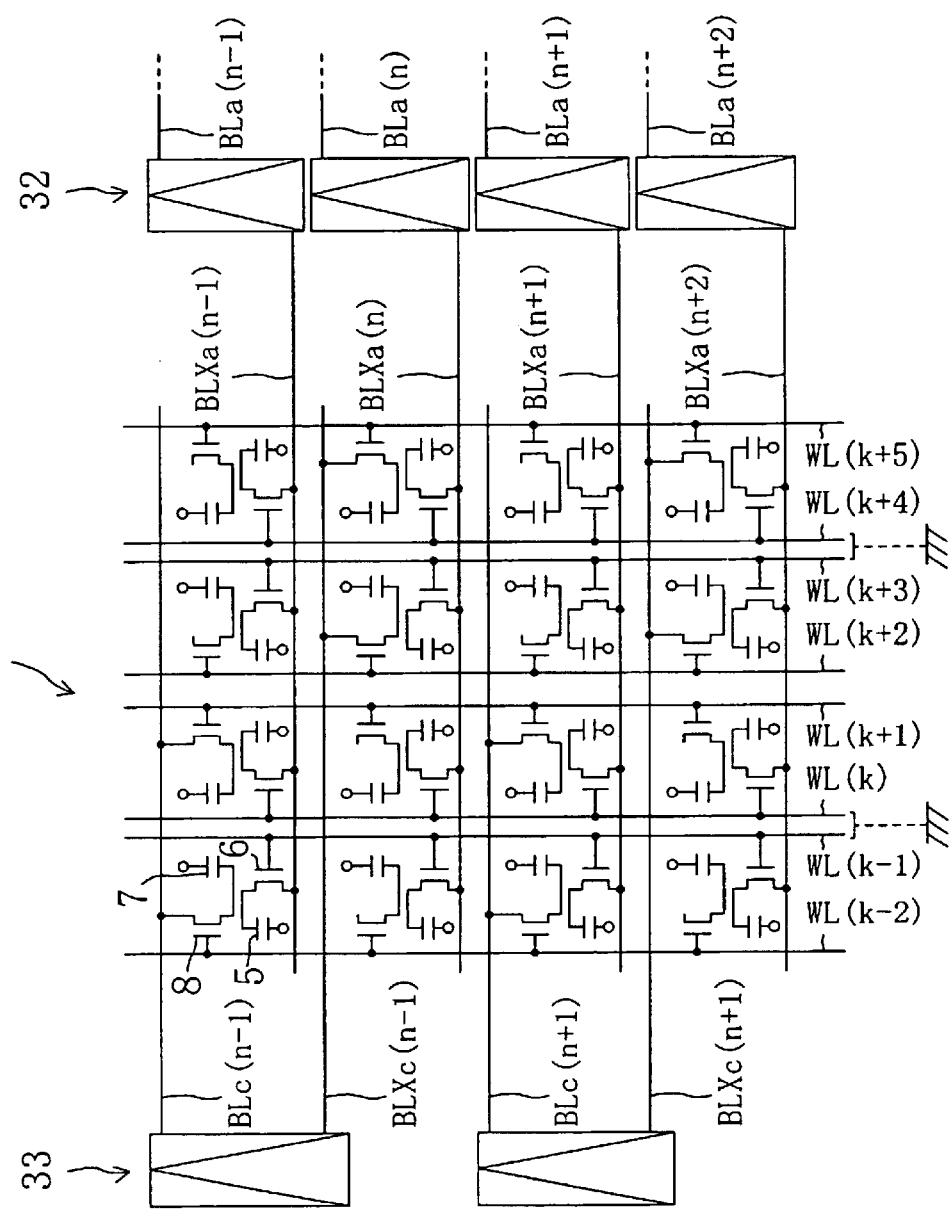
FIG. 4 is a circuit diagram for showing a second exemplified detailed configuration of the end memory cell array of FIG. 1.

FIG. 4 shows a second exemplified detailed configuration of the end memory cell array 20 of FIG. 1. This configuration corresponds to the case where each 2Tr1C type cell of the conventional dummy array is replaced with two 1Tr1C type cells. In FIG. 4, merely 8×4 1Tr1C cells are shown for simplification, and word lines WL(k−2) through WL(k+5) extend into the end memory cell array 20. In the end memory cell array 20, an end bit line BLc(n−1) and an end complementary bit line BLXc(n−1) together forming a folded bit line pair are disposed so as to sandwich one A port complementary bit line BLXa(n−1), and similarly, an end bit line BLc(n+1) and an end complementary bit line BLXc(n+1) together forming a folded bit line pair are disposed so as to sandwich another A port complementary bit line BLXa(n+1). Each 2Tr1C. type cell of the conventional dummy array is replaced with a first 1Tr1C type cell composed of a data storage capacitor 5 and an access transistor 6 and a second 1Tr1C type cell composed of a data storage capacitor 7 and an access transistor 8. The access transistor 6 of the first 1Tr1C type cell has a source connected to one electrode of the data storage capacitor 5, a gate connected to one of the word lines WL(k−1), WL(k), WL(k+3) and WL(k+4) and a drain connected to one of A port complementary bit lines BLXa(n−1) through BLXa(n+2). The access transistor 8 of the second 1Tr1C type cell has a source connected to one electrode of the data storage capacitor 7, a gate connected to one of the word lines WL(k−2), WL(k+1), WL(k+2) and WL(k+5) and a drain connected to one of the end bit lines BLc(n−1) and BLc(n+1) and the end complementary bit lines BLXc(n−1) and BLXc(n+1). The bit line contacts of the drains of the access transistors 8 arranged along the word line direction so as to form the second 1Tr1C type cells may be alternately disconnected as shown in FIG. 4. The other electrode of each of the data storage capacitors 5 and 7 is connected to a constant supply voltage.

In the configuration of FIG. 4, when one of the word lines WL(k−1), WL(k), WL(k+3) and WL(k+4) is selected, a data signal stored in the thus selected data storage capacitor 5 is read through the second open bitline type sense amplifier circuit 32. At this point, the A port bit lines BLa(n−1) through BLa(n+2) apply a voltage, with reference to the A port complementary bit lines BLXa(n−1) through BLXa(n+2), to the second open bitline type sense amplifier circuit 32. Also, when one of the word lines WL(k−2), WL(k+1), WL(k+2) and WL(k+5) is selected, a data signal stored in the thus selected data storage capacitor 7 is read through the folded bitline type sense amplifier circuit 33. At this point, a reference voltage is applied to the folded bitline type sense amplifier circuit 33 by the end complementary bit lines BLXc(n−1) and BLXc(n+1) when the end bit lines BLc(n−1) and BLc(n+1) are used for reading data signals and by the end bit lines BLc(n−1) and BLc(n+1) when the end complementary bit lines BLXc(n−1) and BLXc(n+1) are used for reading data signals. In this embodiment, since the bit line contacts of the drains of the access transistors 8 arranged along the word line direction so as to form the second 1Tr1C type cells are alternately disconnected, a data signal is not read simultaneously to the folded bit line pair, such as the pair of the end bit line BLc(n−1) and the end complementary bit line BLXc(n−1). The description of a write access and the like of the end memory cell array 20 is herein omitted.

As described so far, when the configuration of FIG. 4 is employed, the end memory cell array 20, which corresponds to the conventional dummy array unable to access, can be utilized for the data storage, resulting in increasing usable memory capacity. In addition, since, for example, the end bit line BLc(n−1) and the end complementary bit line BLXc(n−1) are disposed so as to sandwich the A port complementary bit line BLXa(n−1) in the end memory cell array 20, the interference such as noise propagation between the pair of the end bit line BLc(n−1) and the end complementary bit line BLXc(n−1) and the A port complementary bit line BLXa(n−1) can be prevented.

When the word lines WL(k−1), WL(k), WL(k+3) and WL(k+4) are all kept in an unselected state as shown with broken lines in FIG. 4, the end memory cell array 20 can be always accessed independently of the 2Tr1C memory cell array 10. This architecture is suitably employed in the case where the 2Tr1C memory cell array 10 is used as a main memory cell array and the end memory cell array 20 is used as a cache memory cell array. Also when the word lines WL(k−2), WL(k+1), WL(k+2) and WL(k+5) are all kept in an unselected state instead of the word lines WL(k−1), WL(k), WL(k+3) and WL(k+4), the effect to increase the memory capacity can be attained.

Figure 5:
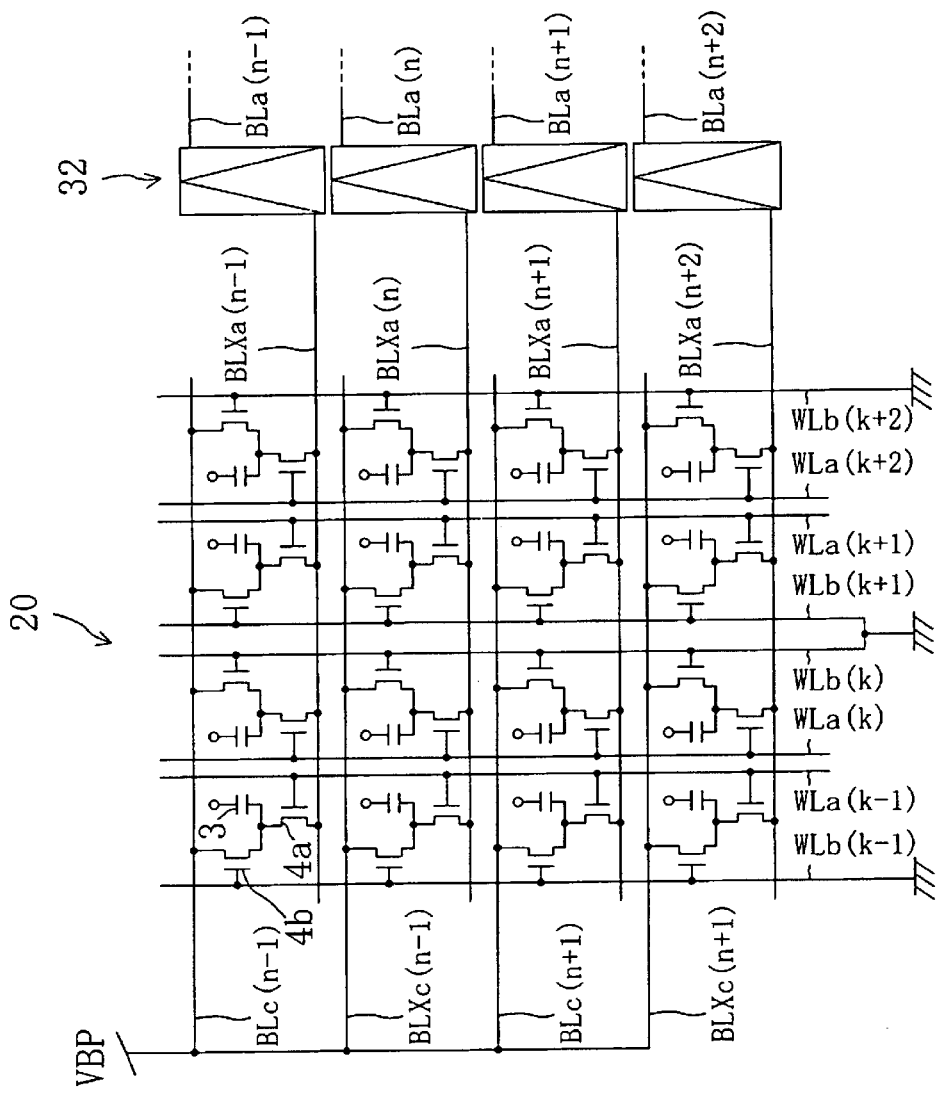
FIG. 5 is a circuit diagram of a modification of the configuration of FIG. 3.

FIG. 5 shows a modification of the configuration of FIG. 3. In this modified configuration, the B port of each 2Tr1C type cell of the end memory cell array 20 of FIG. 3 is steadily deactivated. Specifically, the folded bitline type sense amplifier circuit 33 is removed, and the end bit lines BLc(n−1) and BLc(n+1) and the end complementary bit lines BLXc(n−1) and BLXc(n+1) are all fixed to a bit line precharge voltage VBP. Also, all the B port word lines WLb(k−1) through WLb(k+2) are kept in an unselected state. The bit line contacts of the drains of the B port access transistors 4b may not be necessarily disconnected.

In the configuration of FIG. 5, when one of the A port word lines WLa(k−1) through WLa(k+2) is selected, a data signal stored in the thus selected data storage capacitor 3 is read through the second open bitline type sense amplifier circuit 32. Accordingly, the end memory cell array 20, which corresponds to the conventional dummy array unable to access, can be utilized for the data storage, resulting in increasing usable memory capacity. Although the B port access transistors 4b that are steadily deactivated can be omitted, when these transistors 4b are provided, the end memory cell array 20 can be fabricated by using the same layout pattern as that for the 2Tr1C memory cell array 10. Also, as compared with the case where each 2Tr1C type cell of the conventional dummy array is replaced with two 1Tr1 C type cells, the data storage capacitor 3 can advantageously attain a double capacitance value.

What is claimed is:

1. A semiconductor memory comprising:
   a first memory cell array including first memory cells;
   first word lines extending into said first memory cell array;
   a second memory cell array including second memory cells and disposed adjacent to said first memory cell array;
   second word lines extending into said second memory cell array;

a first sense amplifier circuit disposed between said first memory cell array and said second memory cell array; and a second sense amplifier circuit disposed on a side of said second memory cell array opposite to said first sense amplifier circuit, wherein said first sense amplifier circuit is connected to first bit lines extending into said first memory cell array and to second bit lines respectively forming pairs with said first bit lines and extending into said second memory cell array, said second sense amplifier circuit is connected to third bit lines extending into said second memory cell array and to fourth bit lines respectively forming pairs with said third bit lines and extending into said second memory cell array, each of said first memory cells includes:
   a first transistor having a drain connected to one of said first bit lines and a gate connected to one of said first word lines;
   a second transistor having a source connected to a source of said first transistor and a gate connected to another of said first word lines; and
   a first data storage capacitor having two electrodes one of which is connected to the sources of said first and second transistors, and each of said second memory cells includes:
   a third transistor having a drain connected to one of said second bit lines and a gate connected to one of said second word lines;
   a fourth transistor having a drain connected to one of said third or fourth bit lines, a source connected to a source of said third transistor and a gate connected to another of said second word lines; and
   a second data storage capacitor having two electrodes one of which is connected to the sources of said third and fourth transistors.

2. The semiconductor memory of claim 1, wherein one of said third bit lines and one of said fourth bit lines together forming a pair are disposed in said second memory cell array in such a manner that one of said second bit lines is sandwiched therebetween.

3. The semiconductor memory of claim 1, wherein each one of said second word lines connected to the gate of said third transistor is kept in an unselected state.

4. A semiconductor memory comprising:

a first memory cell array including first memory cells;

first word lines extending into said first memory cell array;

a second memory cell array including second memory cells and third memory cells and disposed adjacent to said first memory cell array;

second word lines extending into said second memory cell array;

a first sense amplifier circuit disposed between said first memory cell array and said second memory cell array; and a second sense amplifier circuit disposed on a side of said second memory cell array opposite to said first sense amplifier circuit, wherein said first sense amplifier circuit is connected to first bit lines extending into said first memory cell array and to second bit lines respectively forming pairs with said first bit lines and extending into said second memory cell array, said second sense amplifier circuit is connected to third bit lines extending into said second memory cell array and to fourth bit lines respectively forming pairs with said third bit lines and extending into said second memory cell array, each of said first memory cells includes:
   a first transistor having a drain connected to one of said first bit lines and a gate connected to one of said first word lines;
   a second transistor having a source connected to a source of said first transistor and a gate connected to another of said first word lines; and
   a first data storage capacitor having two electrodes one of which is connected to the sources of said first and second transistors, each of said second memory cells includes:
   a third transistor having a drain connected to one of said second bit lines and a gate connected to one of said second word lines; and
   a second data storage capacitor having two electrodes one of which is connected to a source of said third transistor, and each of said third memory cells includes:
   a fourth transistor having a drain connected to one of said third or fourth bit lines and a gate connected to another of said second word lines; and
   a third data storage capacitor having two electrodes one of which is connected to a source of said fourth transistor.

5. The semiconductor memory of claim 4, wherein one of said third bit lines and one of said fourth bit lines together forming a pair are disposed in said second memory cell array in such a manner that one of said second bit lines is sandwiched therebetween.

6. The semiconductor memory of claim 4, wherein each one of said second word lines connected to the gate of said third transistor is kept in an unselected state.

7. A semiconductor memory comprising:

a first memory cell array including first memory cells;

first word lines extending into said first memory cell array;

a second memory cell array including second memory cells and disposed adjacent to said first memory cell array;

second word lines extending into said second memory cell array; and a sense amplifier circuit disposed between said first memory cell array and said second memory cell array, wherein said sense amplifier circuit is connected to first bit lines extending into said first memory cell array and to second bit lines respectively forming pairs with said first bit lines and extending into said second memory cell array, each of said first memory cells includes:
   a first transistor having a drain connected to one of said first bit lines and a gate connected to one of said first word lines;
   a second transistor having a source connected to a source of said first transistor and a gate connected to another of said first word lines; and a first data storage capacitor having two electrodes one of which is connected to the sources of said first and second transistors, and each of said second memory cells includes:
  a third transistor having a drain connected to one of said second bit lines and a gate connected to one of said second word lines; and
  a second data storage capacitor having two electrodes one of which is connected to a source of said third transistor.

8. The semiconductor memory of claim 7,
wherein each of said second memory cells further includes a fourth transistor having a drain connected to a fixed voltage, a source connected to the source of said third transistor and a gate connected to another of said second word lines, and each one of said second word lines connected to the gate of said fourth transistor is kept in an unselected state.

* * * * *